United States Patent [19]

Miyata et al.

[11] Patent Number: 5,323,352
[45] Date of Patent: Jun. 21, 1994

[54] REFRESH CONTROL CIRCUIT FOR MEMORY

[75] Inventors: Souichi Miyata; Kouichi Hatakekyama, both of Nara; Tsuyoshi Muramatsu, Chiba, all of Japan

[73] Assignee: Sharp Kabushiki Kaisha, Osaka, Japan

[21] Appl. No.: 754,764

[22] Filed: Sep. 4, 1991

[30] Foreign Application Priority Data

Sep. 7, 1990 [JP] Japan .................. 2-238171

[51] Int. Cl.⁵ .............................................. G11C 7/00
[52] U.S. Cl. ................... 365/222; 365/230.02; 365/233
[58] Field of Search ............... 365/222, 230.02, 233

[56] References Cited

U.S. PATENT DOCUMENTS

| | | | |
|---|---|---|---|
| 4,334,295 | 1/1982 | Nagami | 365/222 |
| 4,344,157 | 8/1982 | White, Jr. et al. | 365/222 |
| 4,677,592 | 6/1987 | Sakurai et al. | 365/222 |
| 4,829,484 | 5/1989 | Arimoto et al. | 365/222 |

FOREIGN PATENT DOCUMENTS

| | | |
|---|---|---|
| 0082287 | 5/1982 | Japan .................. 365/222 |
| 59-45691 | 3/1984 | Japan . |
| 0252189 | 10/1990 | Japan .................. 365/222 |

Primary Examiner—Eugene R. LaRoche
Assistant Examiner—Son Dinh

[57] ABSTRACT

A refresh control circuit includes a refresh request generating circuit, a multiplexer, a memory access control circuit and an elimination control circuit. The refresh request generating circuit periodically outputs a transfer pulse and a refresh packet for refreshing. The merging control circuit receives a transfer pulse for normal access and a transfer pulse for refreshing. The merging control circuit, when the transfer pulse for refreshing and the transfer pulse for normal access contend with each other, applies first the transfer pulse to the memory access control circuit, makes the other stand by and generates an identification signal for identifying normal access and refreshing. The multiplexer receives a refresh packet and a data packet and applies one of the packets to the memory access control circuit in response to the identification signal. The memory access control circuit selectively controls a normal access operation based on the data packet or a refresh operation based on the refresh packet in response to the identification signal to output a transfer pulse. When an identification signal indicates a refresh operation, the elimination control circuit eliminates a transfer pulse output from the memory access control circuit.

13 Claims, 8 Drawing Sheets

REFRESH CONTROL CIRCUIT FOR MEMORY

BACKGROUND OF THE INVENTION

1. Field of the Invention

The present invention relates generally to refresh control circuits for memories, and more particularly, to circuits for controlling a refresh operation of memories in a data drive system and a method of controlling the same.

2. Description of the Background Art

Use of dynamic random access memories (referred to as DRAMs hereinafter) as memory devices in various data processing systems require refresh processing of the memory devices in a finite cycle.

In a synchronous type system such as a microprocessor including a synchronous data processing device, such memory access as instruction fetch and data access is in general performed periodically in response to a reference clock signal. FIG. 10 shows two refreshing manners in the synchronous type system. For a first memory, a periodic refresh cycle is provided between periodic memory access cycles. In a second memory, memory access is carried out in parallel with refreshing. This is referred to as hidden refresh. In such synchronization type systems, switching between memory access and refreshing or identification thereof is controlled based on a reference clock signal.

In some synchronous type systems, a refresh operation is carried out once for several memory access times but not for each memory access, and in others, refresh is carried out in a burst manner in a fixed cycle. A refreshing operation is cyclically performed in response to a reference clock signal in either system.

A data flow type system is also developed in which processing is carried out in accordance with a flow of data in synchronization with pulses. A data flow type system in which data flows periodically enables the similar processing for refreshing to that of the synchronous type system. In other words, this system allows periodic refresh control by using pulse input for transferring data or data transfer as a clock signal. A data flow type system using a simple pipeline allows the most similar processing. More specifically, one of the simplest refresh control methods is to provide a refresh cycle immediately after each periodic memory access cycle. In this case, however, this method should be adapted to prevent distortion of a data flow when refresh is carried out once for several memory access times as in the synchronous system or refresh is performed in a burst manner.

Both of the above-described systems require some pulse periodically input. Thus, refresh processing is achieved by the control for interposing a refresh cycle in response to the pulse and determining time allotment of an access cycle and a refresh cycle.

The above described synchronous system and the system with a periodic data flow enable activation of a periodic refreshing operation without contention with memory access by using a free running reference clock signal.

Of the data flow type system, a data driven type system (hereinafter referred to as a data driven system) has the following three operational characteristics with respect to refresh control.

(1) No reference clock signal exists.

(2) Data flows in accordance with the timing at which data to be processed is generated.

(3) Processing is carried out only when data to be processed is generated.

Therefore, refreshing processing should be carried out in the data driving system on the premise of the above-described characteristics. Application of the above-described refresh processing method in the synchronous type system or the system with a periodic data flow to the data driven system presents some problems.

As described in (1), the data driven system is not capable of activating periodic refreshing because there is no reference clock signal for use in a synchronous type system. This problem can be resolved by periodically activating refresh processing by using a peripheral circuit, for example.

In the data driven type system, however, memory access is carried out irregularly as described in (2) and the access timing cannot be anticipated. Therefore, even if a refresh cycle is periodically activated by the above-described method, memory access might be induced in the refresh cycle. In such a case, the memory access is ignored or the refresh cycle terminates halfway. As described in the foregoing, the above-described resolution has shortcomings.

One resolution to this problem is a method of synchronizing activation of a refresh cycle with memory access. For example, such method is presented as activating a refresh cycle at the end of a memory access cycle. However, memory access is induced only when data to be processed exists according to (3) above. Therefore no memory access is induced when no data to be processed exists. According to the above-described method for solving the problem, no refresh processing is performed when no memory access is induced. Therefore, when no data to be processed exists for a sufficiently long period of time with respect to a time interval of a refresh cycle, no refresh processing will be carried out for the corresponding long period of time. This does not meet the requirement of periodic refresh processing to be carried out. In view of the foregoing, the method of activating a refresh cycle in synchronization with memory access is not satisfactory.

SUMMARY OF THE INVENTION

An object of the present invention is to provide a refresh control circuit capable of satisfactorily performing refresh processing even in a system without a reference clock signal and a method of controlling a refresh operation.

Another object of the present invention is to provide a refresh control circuit for a memory capable of satisfactorily refreshing a memory operation even in a data driven type system in which an operation is carried out only when data to be processed exists and a method of controlling refresh.

A refresh control circuit for a memory according to the present invention includes a refresh request circuit, a merging circuit and a control circuit. The refresh request circuit periodically generates a refresh request signal. The merging circuit receives a normal access request signal and a refresh request signal from the refresh request circuit, outputs one of the request signals and makes the other request signals stand by. The control circuit controls a normal access or a refreshing operation of a memory in response to an output of the merging circuit.

In the refresh control circuit for a memory, a refresh request signal is periodically generated for activating the memory to perform a refresh operation. When a normal access request signal for activating a normal access of a memory contends with a refresh request signal, one of these request signals is output and the other request signal enters a stand-by state. The standing-by request signal is output after finishing the access or the refresh operation by the previously output request signal. Therefore, it is possible to periodically perform a refresh operation even if memory access is carried out irregularly.

That is, refresh processing can substantially be performed periodically without ignoring refreshing or memory access, or without finishing the memory access or the refresh cycle halfway. It is therefore possible to satisfactorily carry out refresh processing even in the system using no reference clock signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the drawings in the following.

Figure 1:
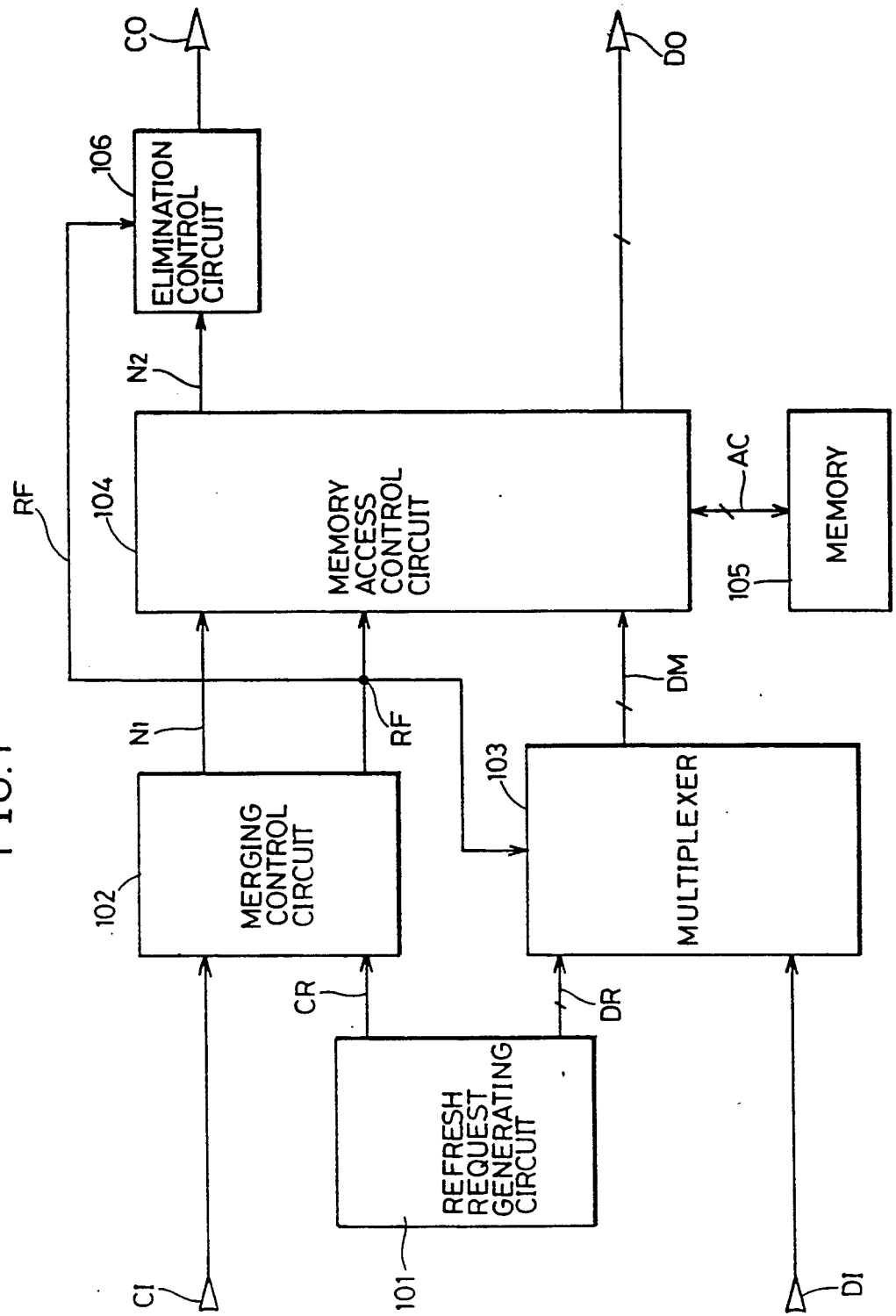
FIG. 1 is a block diagram showing an arrangement of a refresh control circuit for a memory according to one embodiment of the present invention.

FIG. 1 is a block diagram showing an arrangement of a refresh control circuit for a memory according to one embodiment of the present invention.

The refresh control circuit includes a refresh request generating circuit 101, a merging control circuit 102, a multiplexer 103, a memory access control circuit 104 and an elimination control circuit 106. An input terminal CI receives a transfer pulse and an input terminal DI receives a data packet. An output terminal CO outputs a transfer pulse and an output terminal DO outputs a data packet. A data packet applied to the input terminal DI includes an address, write data, read/write instructions and the like which are required for memory access.

The refresh request generating circuit 101 periodically generates a refresh packet including an address required for refreshing and outputs the same to a node DR and a transfer pulse to a node CR. The merging control circuit 102 merges the transfer pulse applied to the input terminal CI with the transfer pulse applied to the node CR to output the merged pulses to a node N1 at a fixed time interval in the order of input. At the same time, the merging control circuit 102, in synchronization with the outputs of these transfer pulses, outputs to a node RF an identification signal for identifying each transfer pulse with its source node. For example, it is assumed that an identification signal of "1" is output to the node RF when a transfer pulse applied from the node CR is output to the node N1. The time interval for outputting the transfer pulse is set to be longer than a time period required for both memory access and refresh.

The multiplexer 103 selects either a refresh packet output to the node DR or a data packet applied to the input terminal DI and outputs the selected packet to a node DM in accordance with a value of an identification signal at the node RF. Herein, the multiplexer 103 outputs a refresh packet of the node DR when the identification signal at the node RF is "1" and outputs the data packet of the input terminal DI when the identification signal is "0".

The memory access control circuit 104 controls access or refresh of a memory 105 in response to the identification signal at the node RF when a transfer pulse is input from the node N1. Access and refresh of the memory 105 are controlled through a node AC. In this case, the memory access control circuit 104 controls a refresh operation of the memory 105 when the identification signal at the node RF is "1" and controls access of the memory 105 when the identification signal is "0". The memory access control circuit 104 outputs a transfer pulse to a node N2 after finishing a memory access cycle or a refresh cycle.

In addition, the memory access control circuit 104 outputs a data packet including read data to the output terminal DO only when memory access control is performed.

The memory access control circuit 104 is allowed to output a data packet to the output terminal DO both in memory access control and refresh control.

The elimination control circuit 106 outputs a transfer pulse which is output to the node N2 to the output terminal CO or eliminates the transfer pulse in response to an identification signal of the node RF. In this case, the elimination control circuit 106 eliminates a transfer pulse when the identification signal of the node RF is "1". In other words, when an identification signal is "1", and while a transfer pulse is applied to the node N2, no transfer pulse is output to the output terminal CO.

An operation of the refresh control circuit of FIG. 1 will be described with reference to the timing chart of FIG. 2.

At a time t1, the refresh request generating circuit 101 outputs a refresh packet to the node DR and a transfer pulse to the node CR at the same time. The merging control circuit 102 performs a merging operation in response thereto. At time t1, with no transfer pulse being applied to the input terminal CI, the merging control circuit 102 transfers the transfer pulse applied, without changing it, to the node N1 and outputs the same. At the same time, the merging control circuit 102 outputs an identification signal being "1" to the node RF. The multiplexer 103 outputs a refresh packet to the node DM in response to the identification signal being "1". As a result, the memory access control circuit 104 performs refresh control of the memory 105 through the node AC.

The memory access control circuit 104 outputs a transfer pulse to the node N2 after finishing a refresh cycle (at time t2). With the identification signal being "1", the elimination control circuit 106 eliminates the transfer pulse applied to the node N2 to prevent output of a transfer pulse to the output terminal CO. A series of refresh processing is carried out in this way.

Then, at time t3, a data packet is applied to the input terminal DI and a transfer pulse for memory access is applied to the input terminal CI at the same time. As a result, the merging control circuit 102 performs a merging operation. In this case, with no transfer pulse applied to the node CR, the merging control circuit 102 transfers the transfer pulse applied to the input terminal CI, without changing it, to the node N1 and outputs the same. At the same time, the merging control circuit 102 outputs an identification signal of "0" to the node RF. The multiplexer 103 outputs the data packet which is applied to the input terminal DI to the node DM in response to the identification signal being "0". As a result, the memory access control circuit 104 executes memory access control (data reading or writing) of the memory 105 through the node AC based on a data packet. After finishing the memory access control, the memory access control circuit 104 outputs the data packet obtained by the access to the output terminal DO and at the same time, outputs a transfer pulse to the node N2 (time t4). With the identification signal being "0", the elimination control circuit 106 outputs the transfer pulse which is output to the node N2 to the output terminal CO. A series of memory access processing is carried in this way.

At time t5, a refresh cycle is activated by the transfer pulse output from the refresh request generating circuit 101 to the node CR. At time t6 in the refresh cycle, a data packet for memory access is applied to the input terminal DI and a transfer pulse is applied to the input terminal CI. In this case, the merging operation carried out by the merging control circuit 102 causes the transfer pulse applied to the input terminal CI to stand by for output. At time t7, after a lapse of a predetermined time from the time t5 when the transfer pulse applied to the node CR is output to the node N1, the transfer pulse applied to the node CI is output to the node N1. At this time, the identification signal of the node RF changes to "0". The former refresh operation has been terminated at this time point. Memory access control is carried out hereinafter in the same manner as described above.

At time t9 immediately after the output of the transfer pulse applied to the input terminal CI to the node N1 at time t8, the refresh request generating circuit 101 outputs a transfer pulse to the node CR. In this case, the merging operation carried out by the merging control circuit 102 causes the transfer pulse applied to the node CR to stand by for output and at time t10 the transfer pulse is output to the node N1.

Also in a case where no transfer pulse is input to the input terminal CI, refresh data and a transfer pulse generated in the refresh request generating circuit 101 enable refresh processing to be periodically performed.

Figure 3:
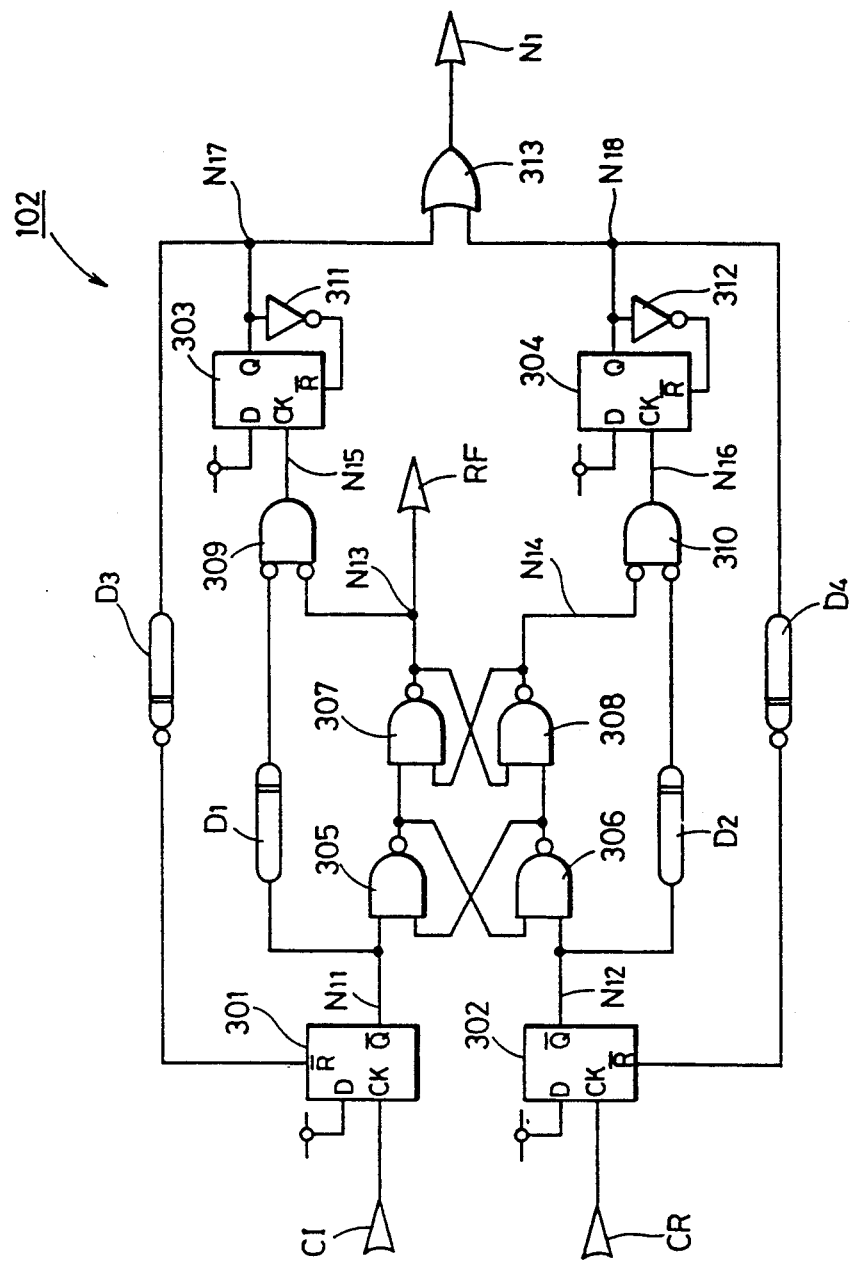
FIG. 3 is a circuit diagram showing one example of an arrangement of a merging control circuit included in the embodiment of FIG. 1.

FIG. 3 is a circuit diagram showing one example of an arrangement of the merging control circuit 102 shown in FIG. 1.

The merging control circuit 102 includes D type flip-flops 301, 302, 303 and 304, NAND gates 305, 306, 307 and 308, NOR gates 309 and 310, inverters 311 and 312, an OR gate 313 and delay circuits D1, D2, D3 and D4. The NAND gates 305 and 306 constitute a first flip-flop and the NAND gates 307 and 308 constitute a second flip-flop.

Figure 2:
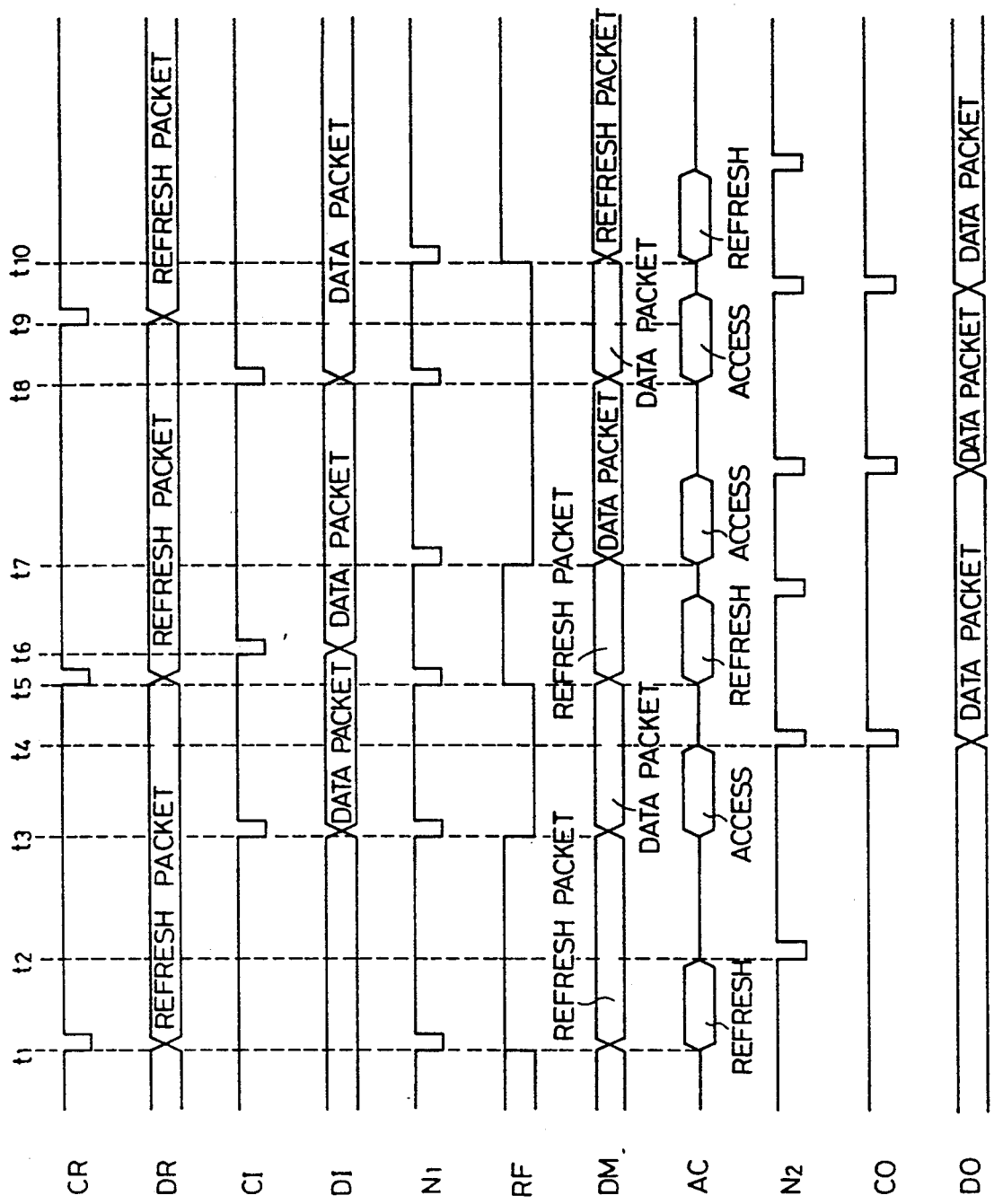
FIG. 2 is a timing chart explaining an operation of the refresh control circuit of FIG. 1.

In FIG. 2, a negative transfer pulse is applied to the input terminal CI and the node CR and a negative transfer pulse is output to the node N1. In the circuit example of FIG. 3, however, it is assumed that a positive transfer pulse is applied to the input terminal CI and the node CR and a positive transfer pulse is output to the node N1.

The flip-flops 301 and 302 respectively store a positive transfer pulse applied to the input terminal CI and a positive transfer pulse applied to the node CR to output "0" to nodes N11 and N12. When the output of the node N11 attains "0" prior to the output of the node N12, the output of the node N13 attains "0". Conversely, when the output of the node N12 attains "0" prior to the output of the node N11, the output of the node N14 attains "0". The nodes N13 and N14 output values inverse to each other.

Therefore, when a positive transfer pulse is applied to the node CR prior to the input terminal CI, the output of the node N12 first attains "0". Then, the output of a node N14 attains "0" and the output of a node N13 attains "1". As a result, an identification signal of "1" is output to the node RF. In addition, the output of a node N16 rises to "1". The rising edge is converted into a positive pulse by the flip-flop 304 and the inverter 312, wherein a positive pulse is output as a transfer pulse to the node N1 through a node and 18 the OR gate 313. The positive pulse is also applied to a reset terminal R̄ of the flip-flop 302 through the delay circuit D4. As a result, the flip-flop 302 is reset after a fixed time period.

If the output of the node N11 is "0" at this time point, the output values of the nodes N13 and N14 are inverted to each other. As a result, an identification signal of "0" is output to the node RF and the flip-flop 303 and the inverter 311 convert the rising edge of the output of a node N15 into a positive pulse. The positive pulse is output as a transfer pulse to the node N1 through a node N17 and the OR gate 313. In addition, the positive pulse is applied to the flip-flop 301 through the delay circuit D3. As a result, the flip-flop 301 is reset after a fixed time period.

As described above, when a positive transfer pulse is applied to the node CR prior to the input terminal CI, a positive transfer pulse is output to the node N1 and an identification signal of "1" is output to the node RF. In this case, the transfer pulse applied to the input terminal CI enters a stand-by state and is output from the node N1 after a lapse of a predetermined time period. At the same time, an identification signal of "0" is output from the node RF.

Conversely, when a positive transfer pulse is applied to the input terminal CI prior to the node CR, a positive transfer pulse is output to the node N1 and an identification signal of "0" is output to the node RF. In this case, the transfer pulse applied to the node CR enters a stand-by state and is output to the node N1 after a lapse of a predetermined time period. At the same time, an identification signal of "1" is output to the node RF.

A merging operation of the merging control circuit 112 is carried out in this way.

Figure 4:
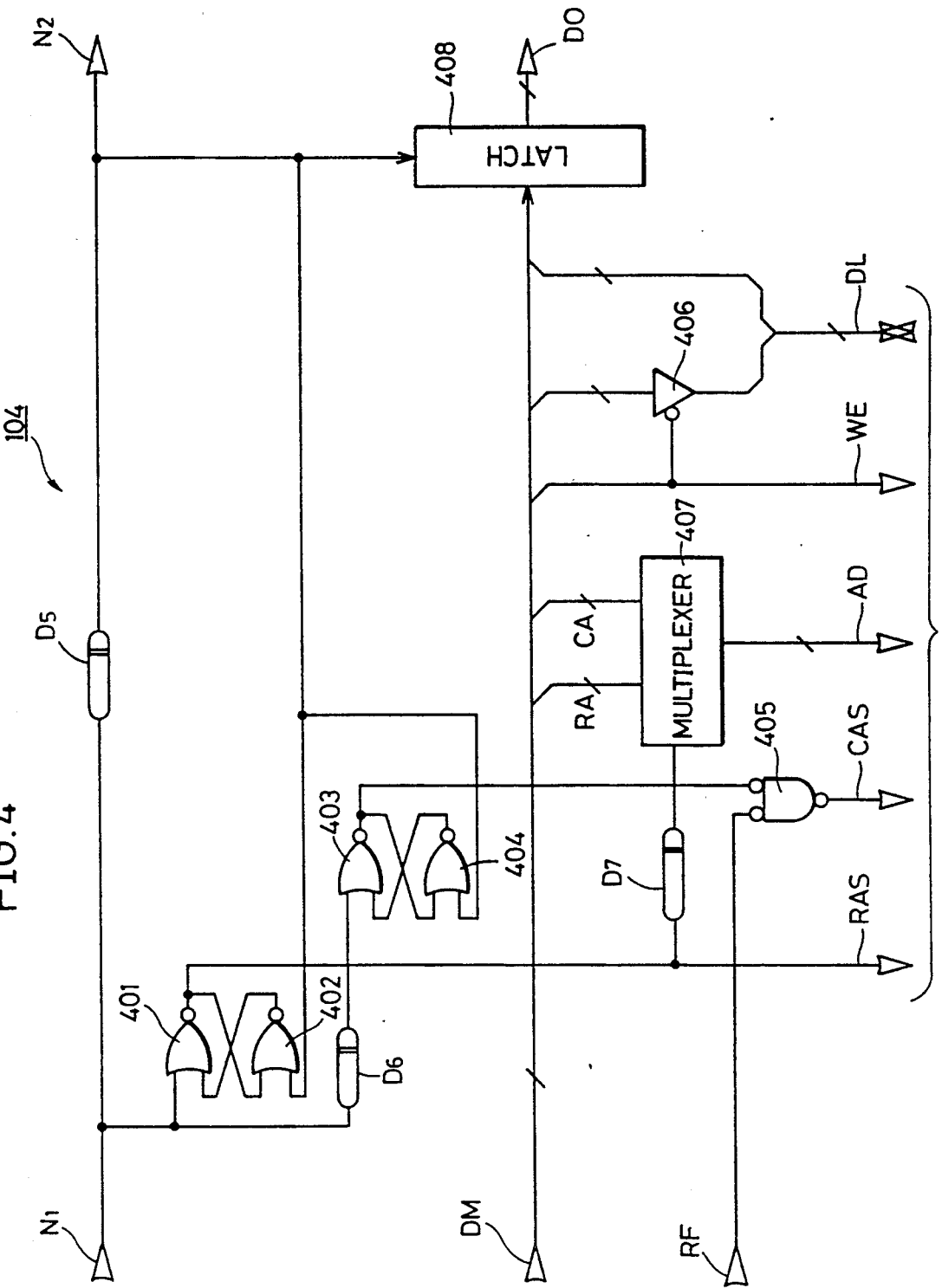
FIG. 4 is a circuit diagram showing one example of an arrangement of a memory access control circuit included in the embodiment of FIG. 1.

FIG. 4 is a circuit diagram showing one example of an arrangement of a memory access control circuit 104 shown in FIG. 1.

The memory access control circuit 104 includes NOR gates 401, 402, 403 and 404, an OR gate 405, a buffer 406, a multiplexer 407, a latch circuit 408 and delay circuits D5, D6 and D7. The NOR gates 401 and 402 constitute a third flip-flop and the NOR gates 403 and 404 constitute a fourth flip-flop.

The node AC shown in FIG. 1 includes a $\overline{RAS}$ line RAS for transmitting a row address strobe signal, a $\overline{CAS}$ line CAS for transmitting a column address strobe signal, an address line AD for transmitting an address signal, a $\overline{WE}$ line WE for transmitting a write enable signal and a data line DL for transmitting data.

It is assumed that a positive transfer pulse is applied to the node N1 and a positive transfer pulse is output to the node N2 also in the circuit example of FIG. 4.

A data packet applied to the node DM includes a row address RA, a column address CA, a write enable signal and write data. The row address RA and the column address CA are applied to the multiplexer 407, the write enable signal is applied to the $\overline{WE}$ line WE and the write data is applied to the buffer 406.

The multiplexer 407 outputs the row address RA onto the address line AD. When a positive transfer pulse is applied to the node N1, the third flip-flop including the NOR gates 401 and 402 is set. As a result, the potential on the $\overline{RAS}$ line RAS falls. The memory 105 of FIG. 1 accepts the row address RA applied from the address line AD in response to the fall of the potential on the $\overline{RAS}$ line RAS. After a predetermined time period, the multiplexer 407 outputs the column address CA onto the address line AD. In addition, after a lapse of a fixed time period after the input of the positive transfer pulse to the node N1, the fourth flip-flop including the NOR gates 403 and 404 is set. As a result, the potential on the $\overline{CAS}$ line CAS falls. The memory 105 of FIG. 1 accepts the column address CA applied from the address line AD in response to the fall of the potential on the $\overline{CAS}$ line CAS.

When an identification signal applied from the node RF is "1", the potential on the $\overline{CAS}$ line CAS does not fall. Therefore, no column address CA is applied to the memory 105 of FIG. 1 in refreshing.

When the write enable signal of the $\overline{WE}$ line WE is "0", the buffer 406 is conductive to output write data onto the data line DL. As a result, write data is written in the memory cell selected by the row address RA and the column address CA in the memory 105. In refreshing, a memory cell in a row selected by the row address RA is refreshed in the memory 105.

When the write enable signal of the $\overline{WE}$ line WE is "1", the memory 105 is in a read state. In this case, therefore, the buffer 406 is at a high impedance state. In the memory 105 shown in FIG. 1, data is read from the memory cell selected by the row address RA and the column address CA, which read data is applied to the data line DL.

As described above, a necessary signal is output to the node AC and a positive transfer pulse applied to the node N1 is output to node N2 after a fixed time period. At the same time, a data packet obtained by access is latched in the latch circuit 408 and output to the output terminal DO. At this time, the signal of the $\overline{RAS}$ line RAS and the signal of the $\overline{CAS}$ line CAS return to "1". Control of the memory 105 is carried out in this way.

Figure 5:
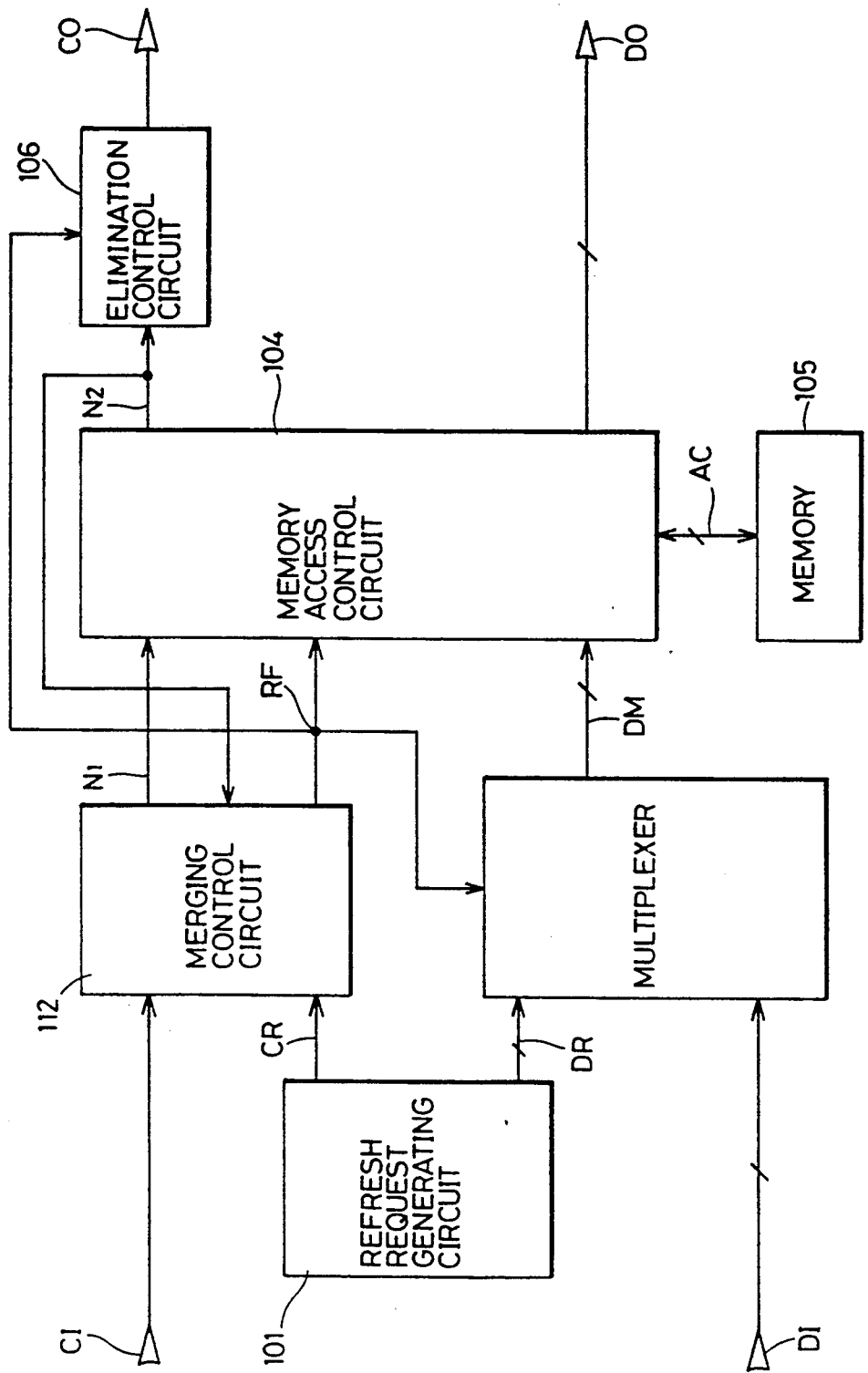
FIG. 5 is a block diagram showing an arrangement of a refresh control circuit for a memory according to another embodiment of the present invention.

FIG. 5 is a block diagram showing an arrangement of a refresh control circuit for a memory according to another embodiment of the present invention.

The embodiment of FIG. 5 is provided with a merging control circuit 112 responsive to a transfer pulse of the node N2 in place of the merging control circuit 102 in the embodiment of FIG. 1. The merging control circuit 102 in the embodiment shown in FIG. 1 outputs a transfer pulse to the node N1 which is followed by output of the subsequent transfer pulse to the node N1 at a longer than fixed time interval. That is, the merging control circuit 102 refrains from outputting a subsequent transfer pulse until a fixed time passes after the output of a transfer pulse. On the other hand, the merging control circuit 112 in the embodiment shown in FIG. 5 outputs a transfer pulse to the node N1 and refrains from outputting a subsequent transfer pulse until memory access or refreshing is carried out in response to the transfer pulse and the transfer pulse is output from the memory access control circuit 104 in the node N2. Arrangements and operations of the other portions are the same as those of the embodiment shown in FIG. 1.

Figure 6:
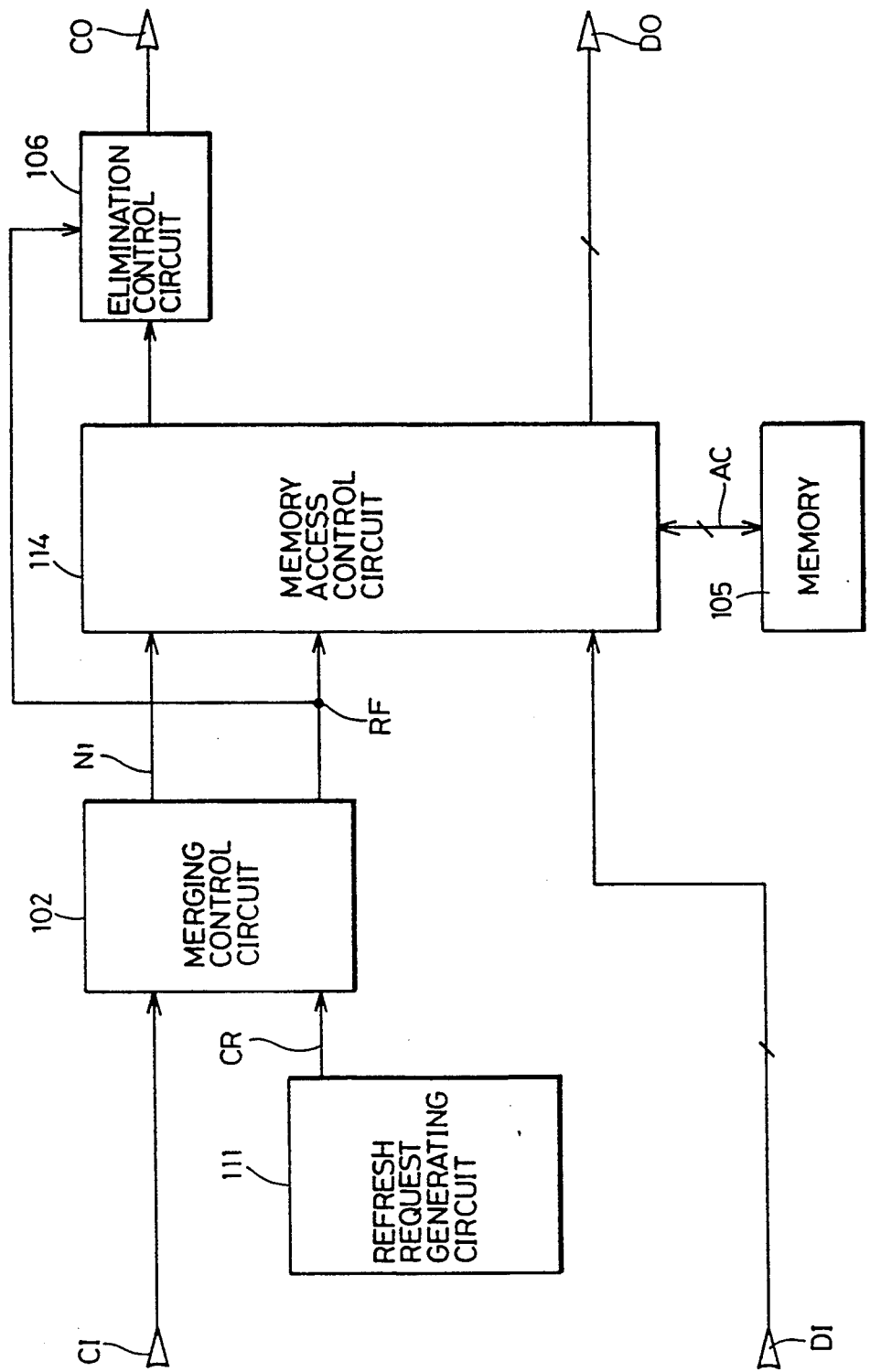
FIG. 6 is a block diagram showing an arrangement of a refresh control circuit for a memory according to a further embodiment of the present invention.

FIG. 6 is a block diagram showing an arrangement of a refresh control circuit for a memory according to a further embodiment of the present invention.

The embodiment of FIG. 6 is provided with a refresh request generating circuit 111 and a memory access control circuit 114 in place of the refresh request generating circuit 101 and the memory access control circuit 104 in the embodiment of FIG. 1 and is provided with no multiplexer 103.

The refresh request generating circuit 111 periodically generates only a transfer pulse for refreshing to the node CR but generates no refresh packet including an address required for refreshing. The memory access control circuit 114 contains a function of generating an address necessary for refreshing. The memory access control circuit 114 generates an address required for refreshing to control refreshing of the memory 105 when the identification signal of the node RF is "1".

Figure 7:
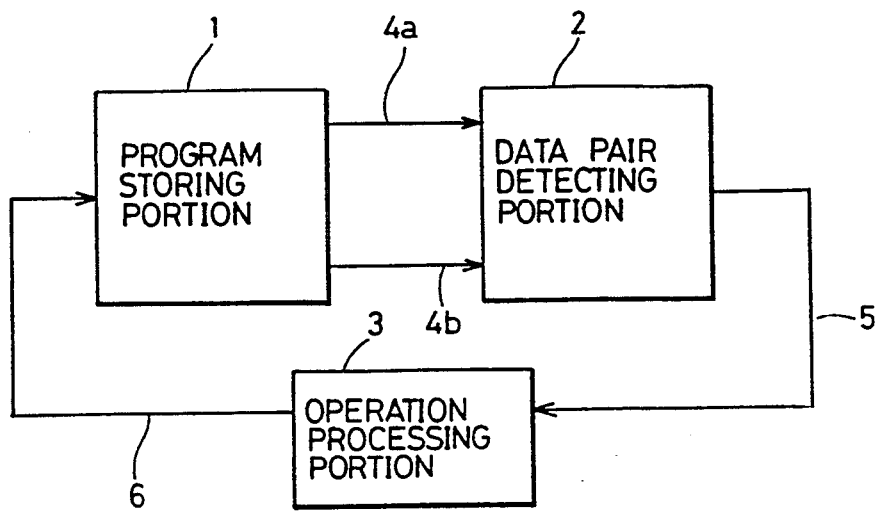
FIG. 7 is a block diagram showing one example of an arrangement of a data flow type information processing device to which the refresh control circuit for a memory according to the present invention is applied.
Figure 8:
FIG. 8 is a diagram showing one example of a field arrangement of a data packet to be processed by the information processing device of FIG. 7.

The refresh control circuit for a memory according to the above-described embodiment is applicable to a data flow type information processing device shown in FIG. 7, for example. An arrangement and operation of the data flow type information processing device of FIG. 7 will be described with reference to FIGS. 8 and 9. FIG. 8 is a diagram showing one example of a field arrangement of a data packet to be processed by the data flow type information processing device of FIG. 7.

The data packet shown in FIG. 8 includes a destination field, an instruction field, a data 1 field and a data 2 field. The destination field stores destination information, the instruction field stores instruction information, and the data 1 field or the data 2 field stores operand data.

The information processing device shown in FIG. 7 includes a program storing portion 1, a data pair detecting portion 2 and an operation processing portion 3.

Figure 9:
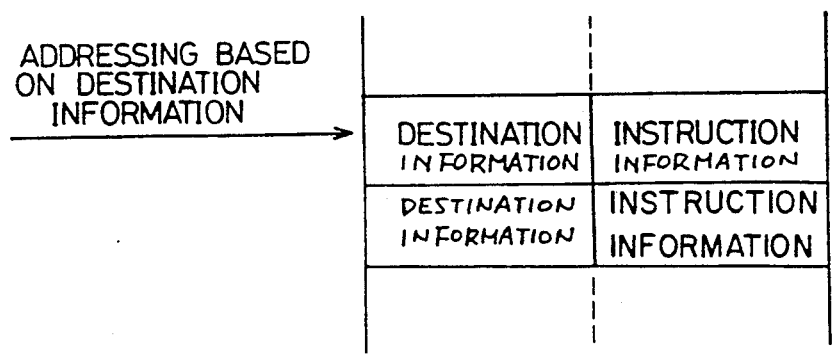
FIG. 9 is a diagram showing one example of a data flow program stored in a program storing portion of the information processing device of FIG. 7.
Figure 10:
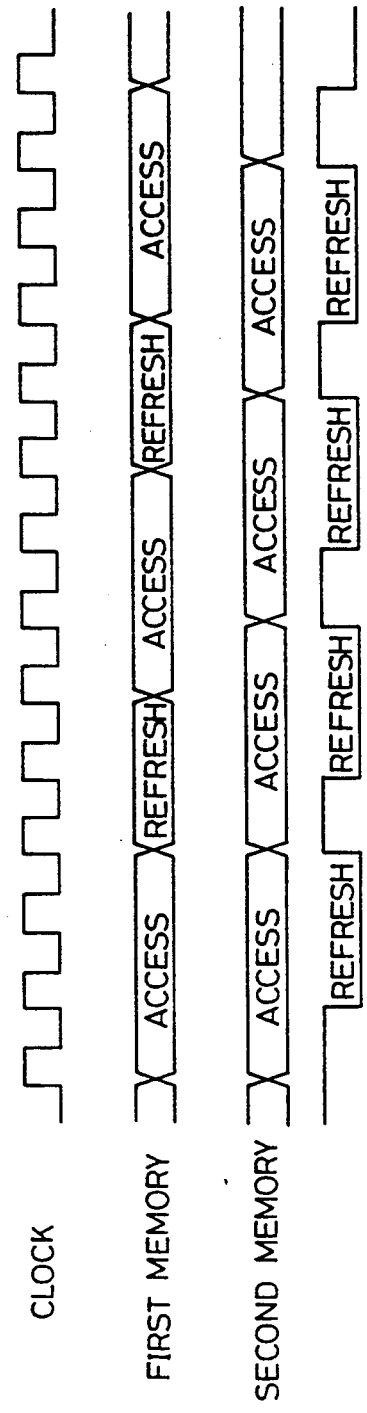
FIG. 10 is a timing chart explaining a conventional refreshing method.

The program storing portion 1 stores the data flow program shown in FIG. 9. Each row of the data flow program includes destination information and instruction information. The program storing portion 1 reads destination information and instruction information of the data flow program by addressing based on destination information of an input data packet as shown in FIG. 9, stores the destination information and the instruction information in the destination field and the instruction field of the data packet and outputs the data packet.

The data pair detecting portion 2 queues data packets output from the program storing portion 1. More specifically, when instruction information indicates a 2 input instruction, the data pair detecting portion detects two different data packets having the same destination field, stores operand data of one of the data packets (the contents of the data field 1 in FIG. 8) in the data 2 field of the other data packet and outputs said the other output data packet. When the instruction information indicates a 1 input instruction, the input data packet is output without changing its contents.

The operation processing portion 3 performs an operation processing with respect to a data packet output from the data pair detecting portion 2 based on the instruction information, stores the operation result in the data 1 field of the data packet and outputs the data packet to the program storing portion 1.

The program storing portion 1 and the data pair detecting portion 2 are coupled with each other by two data transmission paths 4a and 4b. A data packet output from the program storing portion 1 is selectively transmitted through either the data transmission path 4a or 4b. The data pair detecting portion 2 and the operation processing portion 3 are coupled with each other through a data transmission path 5 and the operation processing portion 3 and the program storing portion 1 are coupled with each other through a data transmission path 6.

As a data packet continues to circulate through the program storing portion 1, the data pair detecting portion 2, the operation processing portion 3 and the program storing portion 1, . . . , operation processing proceeds based on the data flow program stored in the program storing portion 1.

The refresh control circuit for a memory according to the above-described embodiment can be used for controlling a program memory for storing the data flow program in the program storing portion 1.

The refresh control circuit for a memory according to the present invention is not exclusively applicable to the data flow type information processing device shown in FIG. 7 but it is applicable to such a system without using a reference clock signal as data driven type systems having other arrangements.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A refresh control circuit for controlling a refresh operation of a memory, comprising:
refresh requesting means for periodically generating a refresh request signal;
merging means for receiving a normal access request signal and said refresh request signal from said refresh request means, outputting one of said normal access request and refresh request signals and making the other of said normal access request and refresh request signals stand by without requiring any sampling period; and
controlling means responsive to the output of said merging means for controlling a normal access operation of said memory or a refresh operation of said memory so that said refresh operation is periodically performed even when the memory access is carried out irregularly.

2. The refresh control circuit according to claim 1, wherein said merging means, when said normal access request signal and said refresh request signal contend with each other, outputs a first received request signal of said normal access request and refresh request signals received by said merging means and outputs a later received request signal of said normal access request and refresh request signals received by said merging means after a lapse of a fixed time period.

3. The refresh control circuit according to claim 1, wherein
said controlling means outputs a pulse signal after the completion of the control of a normal access operation and after the completion of a fresh operation, and
said merging means, when said normal access request signal and said refresh request signal contend with each other, outputs a first received request signal of said normal access request and refresh request signals received by said merging means and outputs a later received request signal of said normal access request and refresh request signals received by said merging means in response to said pulse signal output from said controlling means.

4. The refresh control circuit according to claim 1, wherein
said merging means generates an identification signal for identifying said normal access operation and said refresh operation in response to said normal access request signal and said refresh request signal, and
said controlling means determines whether control of said normal access operation or control of said refresh operation should be performed in response to said identification signal.

5. The refresh control circuit according to claim 4, wherein
said refresh request means further includes refresh information generating means for generating refresh information necessary for said refresh operation, and the refresh control circuit further comprises multiplexing means for receiving externally applied access information required for said normal access operation and said refresh information to apply either said access information or said refresh information to said controlling means in response to said identification signal, and
said controlling means applies said access information to said memory in said normal access operation and applies said refresh information to said memory in said refresh operation.

6. The refresh control circuit according to claim 4, wherein
said controlling means further includes refresh information generating means responsive to said identification signal indicative of said refresh operation for generating refresh information necessary for said refresh operation, and said controlling means applies externally applied access information to said memory in said normal access operation and applies said refresh information to said memory in said refresh operation.

7. The refresh control circuit according to claim 1, wherein said controlling means outputs a pulse signal after the completion of the control of said normal access operation and after the completion of the control of said refresh operation.

8. The refresh control circuit according to claim 7, further comprising pulse signal eliminating means responsive to said identification signal indicative of said refresh operation for eliminating said pulse signal.

9. A refresh control circuit for controlling a refresh operation of a memory, comprising:
- refresh requesting means for periodically generating a refresh request signal;
- merging means for receiving a normal access request signal and said refresh request signal from said refresh requesting means, outputting one of said normal access request and refresh request signals and making the other of said normal access request and refresh request signals stand by without requiring any sampling period, said merging means generates an identification signal for identifying said normal access operation and said refresh operation in response to said normal access request signal and said refresh request signal and further comprises,
- first holding means for holding said normal access request signal,
- second holding means for holding said refresh request signal,
- third holding means for receiving the outputs of said first and second holding means to hold said normal access request signal when only said normal access request signal is applied and to hold said refresh request signal when only said refresh request signal is applied,
- first delaying means for delaying said normal access request signal output from said third holding means by a fixed time period and applying the delayed normal access request signal to said first holding means to reset said first holding means, and
- second delaying means for delaying said refresh request signal output from said third holding means by a fixed time period and applying the delayed refresh request signal to said second holding means to reset said second holding means; and
- controlling means responsive to the output of said merging means for controlling a normal access operation of said memory or a refresh operation of said memory so that said refresh operation is periodically performed even when the memory access is carried out irregularly, said controlling means determines whether control of said normal access operation or control of said refresh operation should be performed in response to said identification signal.

10. A refresh control circuit for controlling a refresh operation of a memory, comprising:
- refresh requesting means for periodically generating a refresh request signal;
- merging means for receiving a normal access request signal and said refresh request signal from said refresh requesting means, outputting one of said normal access request and refresh request signals and making the other of said normal access request and refresh request signals stand by without requiring any sampling period, said merging means generates an identification signal for identifying said normal access operation and said refresh operation in response to said normal access request signal and said refresh request signal; and
- controlling means responsive to the output of said merging means for controlling a normal access operation of said memory or a refresh operation of said memory so that said refresh operation is periodically performed even when the memory access is carried out irregularly, said controlling means determines whether control of said normal access operation or control of said refresh operation should be performed in response to said identification signal;
- wherein said access information includes row address information, column address information, write/read identification information and write information,
- said refresh information includes refresh address information,
- said controlling means includes,
  - first supplying means responsive to either said normal access request signal or said refresh request signal for applying a row address strobe signal to said memory,
  - second supplying means responsive to said normal access request signal and said identification signal indicative of a normal access operation for applying a column address strobe signal to said memory,
  - third supplying means responsive to said row address strobe signal for applying said row address information or said refresh address information to said memory and responsive to said column address strobe signal for applying said column address information to said memory, and
  - fourth supplying means responsive to said write/read identification information indicative of writing for applying said write information to said memory and responsive to write/read identification information indicative of reading for outputting the data read from said memory.

11. The refresh control circuit according to claim 10, wherein said controlling means further includes delaying means for delaying said normal access request signal and said refresh request signal by a fixed time period and outputting the delayed signal.

12. A refresh control circuit for a memory for use in a data driven type system, comprising:
- refresh requesting means for periodically generating a refresh request signal;
- merging means for receiving a normal access request signal and said refresh request signal from said refresh requesting means, outputting one of the normal access request and refresh request signals and making the other of the normal access request and refresh request signals stand by without requiring any sampling period; and
- controlling means responsive to the output of said merging means for controlling a normal access operation of said memory or a refresh operation of said memory so that said refresh operation is periodically performed even when the memory access is carried out irregularly.

13. A method of controlling a memory, comprising the steps of:
(a) periodically generating a refresh request signal;

(b) receiving a normal access request signal and said refresh request signal periodically generated at said step (a);

(c) outputting one of the normal access request and refresh request signals received at said step (b);

(d) making the other of the normal access request and refresh request signals stand by said steps (b)-(d) being completed without requiring any sampling period; and (e) controlling a normal access operation of said memory or a fresh operation of said memory in response to the normal access request or the refresh request signals output at said step (d) so that said refresh operation is periodically performed even when the memory access is carried out irregularly.

* * * * *

UNITED STATES PATENT AND TRADEMARK OFFICE
CERTIFICATE OF CORRECTION

PATENT NO. : 5,323,352

DATED : June 21, 1994

INVENTOR(S) : Souichi MIYATA, Kouichi HATEKEYAMA and Tsuyoshi MURAMATSU

It is certified that error appears in the above-identified patent and that said Letters Patent is hereby corrected as shown below:

On the title page, item [75]:
Please correct the second Inventor's name from "HATAKEKYAMA" to --HATAKEYAMA--.

Signed and Sealed this

Fifteenth Day of November, 1994

Attest:

BRUCE LEHMAN

Attesting Officer

Commissioner of Patents and Trademarks